United States Patent
Platzgummer et al.

(10) Patent No.: US 6,858,118 B2
(45) Date of Patent: Feb. 22, 2005

(54) APPARATUS FOR ENHANCING THE LIFETIME OF STENCIL MASKS

(75) Inventors: Elmar Platzgummer, Vienna (AT); Hans Löschner, Vienna (AT); Gerhard Stengl, Wernberg (AT)

(73) Assignee: IMS-Ionen Mikrofabrikations Systeme GmbH, Vienna (AT)

( * ) Notice: Subject to any disclaimer, the term of this patent is extended or adjusted under 35 U.S.C. 154(b) by 71 days.

(21) Appl. No.: 10/395,572

(22) Filed: Mar. 24, 2003

(65) Prior Publication Data

US 2004/0188243 A1 Sep. 30, 2004

(51) Int. Cl.[7] .............................................. C23C 14/34
(52) U.S. Cl. ........................ 204/298.04; 204/298.03; 204/298.11; 204/298.28
(58) Field of Search ....................... 204/298.03, 298.04, 204/298.11, 298.28

(56) References Cited

U.S. PATENT DOCUMENTS

| | | | |
|---|---|---|---|
| 4,985,634 A | 1/1991 | Stengl et al. | 250/492.2 |
| 5,742,062 A | 4/1998 | Stengl et al. | 250/346 R |
| 6,063,246 A | 5/2000 | Wolfe et al. | 204/192.16 |
| 6,136,160 A | 10/2000 | Hrkut et al. | 204/192.16 |
| 6,583,426 B1 * | 6/2003 | Kawanami et al. | 250/492.21 |
| 2003/0183776 A1 * | 10/2003 | Tomimatsu et al. | 250/442.11 |

FOREIGN PATENT DOCUMENTS

DE    211 885    7/1984

* cited by examiner

*Primary Examiner*—Steven Versteeg
(74) *Attorney, Agent, or Firm*—Sutherland Asbill & Brennan LLP

(57) ABSTRACT

An apparatus for masked ion-beam lithography comprises a mask maintenance module for prolongation of the lifetime of the stencil mask. The module comprises a deposition means for depositing material to the side of the mask irradiated by the lithography beam, with at least one deposition source being positioned in front of the mask, and further comprises a sputter means in which at least one sputter source, positioned in front of the mask holder means and outside the path of the lithography beam, produces a sputter ion beam directed to the mask in order to sputter off material from said mask in a scanning procedure and compensate for inhomogeneity of deposition.

12 Claims, 4 Drawing Sheets

APPARATUS FOR ENHANCING THE LIFETIME OF STENCIL MASKS

FIELD OF THE INVENTION AND DESCRIPTION OF PRIOR ART

The invention relates to an apparatus for masked ion-beam lithography, in which a stencil mask is used to define a pattern on a substrate. In ion-beam lithography, a lithography beam consisting of energetic ions is radiated through the substantially flat stencil mask which comprises a stencil pattern made up of a plurality of transparent structures; the lithography beam then transfers the stencil pattern to a substrate. For this, the ion-beam lithography is provided with a mask holding means to position the stencil mask at an appropriate position in the path of the lithography beam.

Stencil masks used in ion-beam lithography (IBL) are typically made of a silicon wafer or other disk of a suitable material, whose central area is thinned to form a thin membrane, and in the membrane a plurality of openings is formed which constitute the stencil pattern to be imaged onto the substrate realized as, e.g., a resist-covered semiconductor wafer. It is clear that the patterned membrane represents a delicate pattern which is very sensible to variations in its physical parameters, such as inner stress, temperature and material ageing, which may result in distortions of the stencil pattern.

The irradiation of the stencil mask with the lithography beam brings about a substantial load to the stencil mask membrane, due to ion implantation causing crystal defects and mechanical effects such as swelling or shrinking, and due to sputtering from the membrane surface causing a continuous reduction of the membrane swelling. To reduce the impact of these effects, stencil masks are usually provided with protective layers covering the mask, or at least the side of the mask to be irradiated by the lithography beam. For instance, for masks used in IBL with $He^+$ ions, special carbon coatings have been developed to prolong the life time of the delicate stencil masks, as described by Wolfe et al. in U.S. Pat. No. 6,063,246 and Hrkut et al. in U.S. Pat. No. 6,136,160. For heavier ions, however, no suitable mask protection technology is known to date; on the other hand, IBL applications using heavy ions offer new technical applications, such as ion-patterning of storage media.

The main problem due to the ion irradiation even when protective layers are used is the effect of sputtering off, as it is now the protective layer (rather than the basic membrane material) whose thickness is continuously reduced even though the protective layer can be chosen so as to keep low the effect of sputtering. In the DD 211 885 it is proposed to compensate the sputtering-caused thinning of the membrane by deposition of a layer to the membrane until the initial thickness of the mask membrane is recovered. Although this approach is appealing, the implementation of a controlled deposition to the mask and maintenance of a uniform membrane thickness is very difficult, due to possible fluctuations or systematic variations of the deposition rate over the area of the membrane. Moreover, deposition of material to the mask will yield a more uniform coverage of the surfaces present in the pattern structures as compared to sputtering, as will become dear from the following argument.

As can be seen from FIG. 8, the effect of sputtering is strongly dependent on the angle of incidence to the irradiated surface. FIG. 8 shows the behavior of the sputter yield Y (denoting the average number of sputtered-off atoms per impingent atom) as a function of the incidence angle $\alpha$ (measured from the surface normal, cf. insert in FIG. 8) for several materials of the irradiated surface, calculated for an even surface using the SRIM 2000 software package assuming incident Argon ions of 10 keV kinetic energy. In particular, the sputter yield Y shows a prominent maximum at an angle of about 75°, i.e. almost glancing incidence, largely irrespective of the underlying material. Therefore, the sputter effect not only affects the membrane thickness, but also the morphology of the stencil openings in the mask, as the edges and inner sides of the pattern structures are affected in a complicated manner. In the long run, the morphology of the stencil openings in the mask would change considerably despite a compensation of sputtering by deposition as proposed in the DD 211 885. In particular, there would be a misbalance between the erosion/growth of the inner sides of the openings (determining the width of the openings) and the average membrane thickness. Thus, deposition to the membrane alone cannot yield satisfactory results to compensate the irradiation-caused sputtering of material of the membrane surface with respect to the stencil mask morphology.

SUMMARY OF THE INVENTION

It is an object of the present invention to overcome the limitations of the prior art, in order to achieve an effective compensation of the sputtering effects on the mask and a reliable prolongation of the lifetime of the mask during which the stencil pattern present in the mask remains sufficiently stable.

This object is met by an apparatus of the kind as described in the beginning, which further comprises not only a first means for depositing material to the mask, but also an additional second means for sputtering off material from the mask. The first means (deposition means) comprises at least one deposition source being positioned in front of the mask as seen in the direction of the lithography beam and outside the path of the lithography beam, the deposition source(s) being suitable for depositing material to the side of the mask irradiated by the lithography beam, while the second means (sputter means) comprises at least one sputter source producing a sputter ion beam directed to the mask, the sputter source(s) being positioned in front of the mask holder means as seen in the direction of the lithography beam and outside the path of the lithography beam.

The invention allows for an improved compensation of the sputter-induced loss of material, in particular if the ion species used in the lithography beam is a heavy element, i.e., an element heavier than He. One major advantage of the invention lies in the reduced requirements on the homogeneity of the deposition to the mask, as deviations from homogeneity now can easily be compensated by the subsequent sputtering using the second sputter source(s).

The deposition (first) and sputter (second) means may be realized in one device, such as the mask maintenance module of the preferred embodiment described below, or as separate devices within the lithography apparatus.

Preferably, the sputter means (second means) may comprise deflection means to adjust the direction of the sputter ion beam(s); the deflection means may be realised comprising an electrostatic ion-optical arrangement. It is further advantageous if sputtering is done in a scanning procedure over the area of the structure pattern. For this, the lateral size of the sputter ion beam(s), as measured in the plane of the mask, is suitably smaller than the dimension of the structure pattern area of the stencil mask by at least one order of magnitude. In order to provide for an effective sputtering cleaning in the regions between the apertures, the direction of the sputter ion beam forms an angle with the lithography beam (surface normal of mask) which is suitably at least 30°, preferably at least 60°.

In a preferred embodiment of the invention, the second means comprises a plurality of sputter sources arranged on a ring around the lithography beam. Alternatively, the second means comprises a sputter source mounted on a positioning means to rotate the sputter source around an axis as defined by the lithography beam.

In order to control the amount of sputtering needed, a measuring means is provided to measure the thickness and/or the surface profile of the stencil mask in the area of the stencil pattern, the measuring means being connected to a controlling means to control sputtering with the sputter source(s). Furthermore, it is advantageous if the mask holding means comprises an aperture means positioned immediately in front of the side of the mask irradiated by the lithography beam, the aperture means having an aperture corresponding to a selected portion of said side of the mask, thus restricting the effect of sputtering and/or deposition to this portion of the mask.

BRIEF DESCRIPTION OF THE DRAWINGS

In the following, the present invention is described in more detail with reference to the drawings, which schematically show.

DETAILED DESCRIPTION OF THE INVENTION

Figure 1:
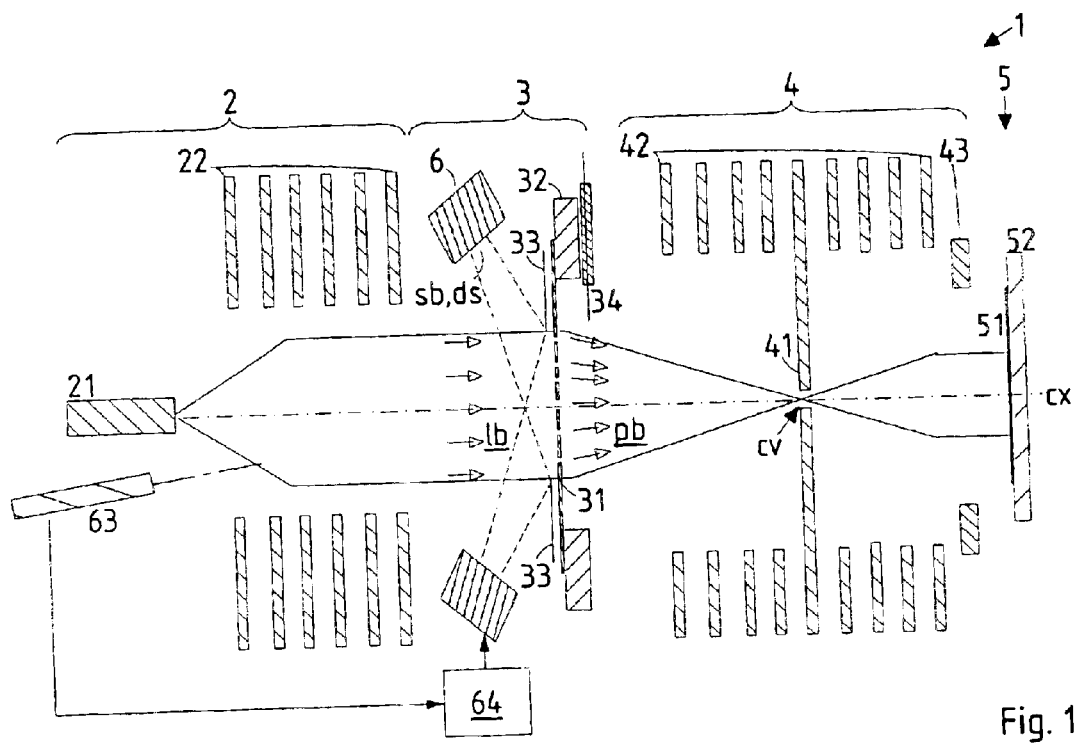
FIG. 1 a longitudinal section of a lithography apparatus realizing the invention.

An overview of a lithographic apparatus according to a preferred embodiment of the invention is shown in FIG. 1. In the following, only those details are given as needed to disclose the invention; further details can be found in the EP 0 344 646 A2 (U.S. Pat. No. 4,985,634) of the applicant, which is herewith included by reference; a similar lay-out is described in the DE 196 27170 A1 (U.S. Pat. No. 5,742,062) of the applicant.

The main components of the lithography apparatus 1 are—corresponding to the direction of the lithography ion beam 1$b$,pb which is from left to right in FIG. 1—an illumination system 2, a mask assembly 3, an imaging system 4, and a target station 5 with the substrate 51. The whole apparatus 1 is contained in a vacuum housing (not shown) held at high vacuum to ensure an unimpeded propagation of the ion beam 1$b$,pb (shown as open arrows) along the optical axis cx of the apparatus. The illumination system comprises an ion source 21 with an extraction system (not shown) fed by a gas supply. In the preferred embodiment, argon ions (Ar$^+$) are used; it should, however, be noted that in general other ions can be applied as well, such as hydrogen or helium ions, or heavy ions; in the context of this disclosure heavy ions refer to ions of elements heavier than C, such as O, N, or the noble gases Ne, Ar, Kr, Xe.

The ion source 21 emits ions of defined energy which, by means of a condenser lens system 22, are formed into a wide, substantially homocentric or telecentric ion beam serving as lithography beam 1$b$. The lithography beam 1$b$ then irradiates a stencil mask 31 in the mask assembly 3, or more accurately, a mask field 313 formed by a mask membrane 311 (FIG. 2) of the stencil mask 31. The mask 31 is held by a mask holder means 32 of the mask assembly at a specific position in the path of the lithography beam 1$b$, which thus irradiates the mask field 313 having a plurality of apertures 310 which together form a stencil pattern that is imaged to the substrate. The mask apertures 310 are the only portions of the mask transparent to the beam 1$b$, which is thus formed into a patterned beam pb emerging from the mask.

The pattern as represented by the patterned beam pb is then projected by means of an optical column 42 onto the substrate 51 where it forms an image of the mask apertures 310. The optical column 42 implements a demagnification of, for instance, 4× with a crossover cv. The substrate 51 is, for instance, a silicon wafer covered with a photo-resist layer. The wafer 51 is held and positioned by the target station 5 comprising a wafer stage 52 in conjunction with a pattern lock system 43 of the imaging system 4.

Figure 2:
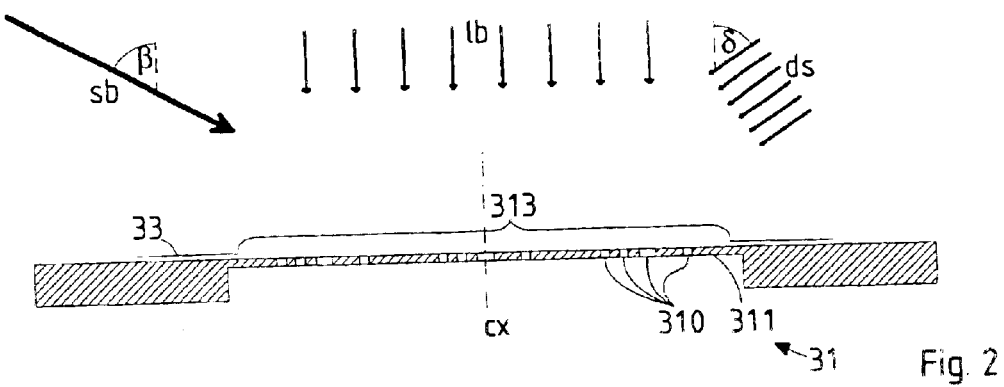
FIG. 2 the principle of the balanced sputter compensation for the mask used in the device of FIG. 1.

FIG. 2 shows the mask 31 and the different kinds of radiation that affect the mask surface within the mask field 313, including the irradiation used for balancing sputter compensation according to the invention. The lithography beam 1$b$ propagates along the optical axis cx (which, in contrast to FIG. 1, runs vertical in FIGS. 2 and 4–6) and impinges on the mask at a direction perpendicular to the mask (front) surface. The irradiation with the energetic ions of the lithography beam will cause sputtering of the mask surface exposed to the beam which, without appropriate countermeasures, would result in a global reduction of the thickness of the mask membrane 311 or, more accurately, of the protection layer covering the mask membrane, as well as local changes to the morphology of the stencil mask apertures 310. In order to provide for a compensation of sputtering effects, material is deposited onto the mask surface, for instance using a gas stream ds produced by a number of deposition source (FIG. 4) and directed towards the wafer field 313. As the deposition sources must be arranged outside of the path of the lithography beam 1$b$, deposition necessarily occurs under an angle δ with respect to the optical axis. It should be noted that the angle δ only denotes the main direction of the deposition flow and can vary over a range corresponding to the divergence of the deposition flow.

As already pointed out, the effects of sputtering as caused by the lithography beam 1$b$ and the growth of material provided by deposition ds do not cancel each other sufficiently due to the different local behavior and angle dependence at the aperture structures of the stencil mask. According to the invention, auxiliary sputtering is provided for by means of at least one sputtering means (FIG. 5) producing a sputter beam sb which is directed at the mask field under an angle β with the direction of the lithography beam (i.e., the optical axis cx). For geometric reasons, the angle β should be at least 30°; preferentially the sources are positioned in such as way that the angle β is in the range of 60° to 70°, as this is the range of the maximum of the angle-dependent sputter yield.

A mask field aperture plate 33 is positioned in front of the mask 31 in order to delimit the area affected by deposition ds and auxiliary sputtering sb to the area of the mask field 313. In contrast to the mask membrane 311, the plate 33 can have a sufficient thickness so that the ageing effect of sputtering to the plate 33 can be neglected.

The ion energy of the sputtering ions will typically be in the range of 0.5 to 5 keV. The ion species used in the sputter sources =6= for auxiliary sputtering is Ar; in a variant, other heavy ions from elements such as O, N, or the noble gases He, Ne, Ar, Kr, Xe, could be used as well. The ion species of auxiliary sputtering should preferably chosen with respect to the material of the material deposited to the mask, namely, such that the quotient of the atomic masses M(sputter ion)/M(deposited) is greater than at least 0.1, preferably greater than 1.

The sputter beam sb is laterally confined so as to affect only a small area of the mask membrane at a time, and is scanned across the area of the mask field 313. The area covered by the sputter beam is at least smaller by an order of magnitude; preferentially, the area corresponds to a chip field area. The scanning motion and/or the intensity and energy of the scanning beam is modulated so as to provide for a variation of the extent of local sputtering as locally needed. It should be noted that the angle β as depicted in FIG. 2 only denotes the main direction of a sputter beam; this angle will actually vary in the course of the scanning motion over a range corresponding to the width of the wafer field.

According to the invention an arrangement which allows for an improved compensation of irradiation-induced sputtering is situated in front of the mask holder means 32 and the mask 31 (as seen in the direction of the lithography beam). In the embodiment shown in FIG. 1, this arrangement is realized as a mask maintenance module (MMM) 6 which is shown in more detail in FIGS. 3 to 5. The MMM is inserted in a field free space between the illumination system 2 and the mask 31, drawn schematically in FIG. 5.

Figure 3:
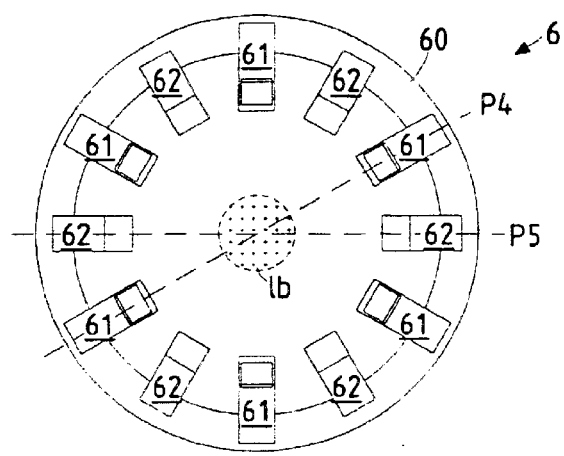
FIG. 3 a plan view of the compensation system of the apparatus of FIG. 1.

FIG. 3 shows a plan view (as seen from the mask plane, i.e., against the direction of the lithography beam 1b) of the MMM 6. On a ring-shaped frame 60 surrounding the lithography beam 1b a plurality of deposition sources 61 and sputter sources 62 are mounted. In the MMM of the embodiment shown, the number of sources is six for each type and the deposition and sputter sources are arranged on the ring frame 60 in an alternating sequence. It should be noted that in principle it would be sufficient to provide one deposition source and one sputter source, for instance at opposite positions with respect to the lithography beam; the number of the sources can also be three, four, five or more sources for each type. Of course, in other variants, the number of deposition sources 61 may be different from the number of sputter sources 62, e.g. two deposition sources and four sputter sources.

The isotropy of the deposition and, in particular, sputtering can further be improved by implementing the frame on which the sources are mounted as a rotating device so that the sources can be rotated around the optical axis of the lithography beam.

To achieve a uniform deposition profile over the entire mask, it is convenient to use several deposition sources 61 distributed rotationally to the optical axis as shown in FIG. 3. Considering the heat load of an electron beam heated crucible to the mask, the evaporation device should favorably be based on nano-second laser pulse induced desorption. Pulsed deposition offers optimum dose stability and additionally a time programmed evaporation during over head periods. This way inelastic scattering of the incoming ions from vapor atoms would have no effect on the imaging resolution.

Likewise, it is advantageous to employ a number of sputter source 62 in order to achieve a sputtering effect as needed independent of the lateral direction towards which a (local) surface is inclined; also, a higher number of sputter sources decreases the time needed to scan over the mask field.

Figure 4:
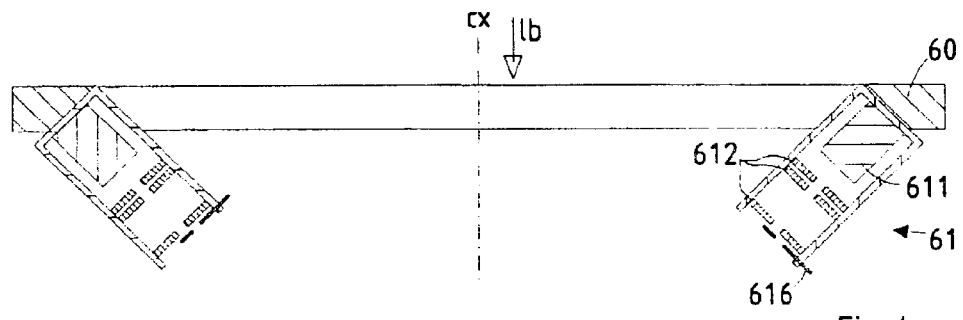
FIG. 4 a detail of a sputter means used in the system of FIG. 3.
Figure 5:
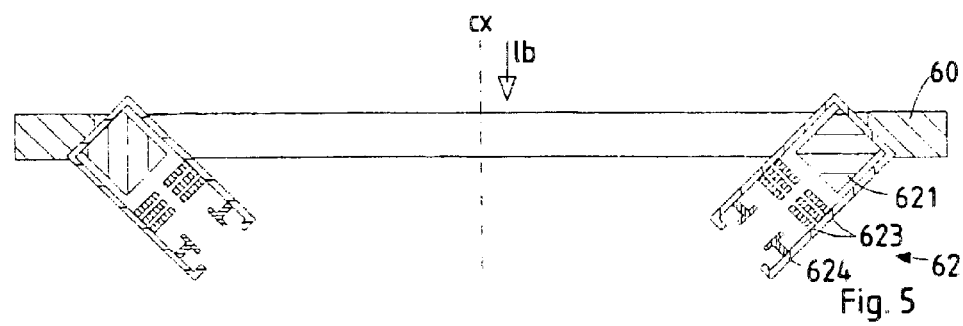
FIG. 5 a detail of a deposition means used in the system of FIG. 3.

FIGS. 4 and 5 show the deposition sources 61 and sputter sources 62 in more detail in sectional views along different longitudinal planes P4 and P5 as denoted in FIG. 3, respectively.

The deposition sources 61 as shown in FIG. 4 allow a uniform deposition of the protective layer material, with a beam diameter matching the ion beam illuminated mask area. The sources 61 employ evaporation of material chosen suitably with regard to the material of the protective layer of the mask 31, preferably the same material as the protective layer (for instance, Al). A deposition source 61 comprises a particle beam source 611, an arrangement of limiting apertures 612 to shape the single beams, and a mechanical shutter 616 to blank out the deposition beams during ion optical exposures. The particle beam sources may be based on standard epitaxy technology, as for example standard e-beam evaporation, glow discharge Ar sputtering or pulsed laser deposition technology.

The deposition sources 61 are chosen with respect to the following attributes in order to allow controlled stabilization to the protective layer:

possible deposition rates in the range of $10^{11}$–$10^{14}$ atoms/ s/cm$^2$, depending on the throughput requirements and sputter efficiency, good overlay of the evaporator beam diameter and the ion beam diameter (virtual source size), control over absolute deposition rate (time stability), in order to avoid side wall deposition inside the stencil openings 310, either a sufficiently large angle of incidence δ, or a sufficiently small angle of incidence δ in conjuntion with a small beam divergence, Further points which are technologically important are:

adjustable size of the evaporation field with respect to the ion beam cross section at mask level (e.g. by limiting apertures 612), sufficient cooling capacity for additional heat load on the mask, small variation (<5%) in the evaporation efficiency over the full evaporation field (of e.g. 4 inch in diameter), so that a variation of the deposition over the mask surface can be balanced by the plurality of sputter cleaning beams.

The material used for evaporation can be a metallic element, preferably a metal having a high surface energy (high heat of vaporization) such as Al, Pt, Cu, Nb, Si, or an organic material in order to deposit carbon or a hydrocarbon material. Further, the protective layer material should have a low tendency to produce ion-beam induced stress; in other words, the intrinsic stress in the layer should be largely independent on the ion dose penetrating the protective layer during ion optical exposures. Materials with these properties are, in general, materials with a low melting point, such as Al or Pb. Beside elastic properties also chemical properties are an issue, as it must be ensured that the surface of the mask is not covered with oxidic or other insulating layers, in order to avoid charging up of the mask surface during operation. In a variant, also a composite material, such as aluminum oxide, can be deposited. In this case the component elements of the composite can be provided by respective deposition sources.

Referring to FIG. 5, a sputter cleaning source 62 comprises an ionization source 621, a focusing lens arrangement 623 consisting of several electrodes, and an electrostatic ion-optical XY deflection arrangement 624 for rastering the ion beam over a respective region of or the entire mask membrane, all beams together effecting a 2-dimensional surface sputtering profile. The raster frequency lies in the range 10 to $10^{-4}$ Hz for each scanning coordinate, and the X:Y frequency ratio is selected to be a prime number so that homogenous surface sputtering is possible by means of the rastered focused ion beams. The spot sizes of the beams used for sputter cleaning are chosen as suitable with regard to the inhomogeneity of the evaporation efficiency, and will typically be in the range of 1–1000 mm.

The deposition and sputter sources 61,62 are pumped differentially (respective pumping systems not shown in the figures) in order to maintain the pressure of the lithography system 1 at the operating value of, for instance, about $1.0 \cdot 10^{-7}$ mbar.

In the embodiment shown in FIG. 1, the compensation system 6 is a component of the mask assembly 3; in other variants, the components of the compensation system 6 may also be positioned at different appropriate places in front of the mask 31.

In the lithography apparatus 1 shown in FIG. 1, a mechanical shutter 34 is positioned behind the mask 31 and mask holder 32 in order to protect the optical system, in particular the imaging system 4, while the deposition or the auxiliary sputtering is performed. Furthermore, a cross over aperture plate 41 may be provided at the position of the cross over cv which is wide enough to let pass the lithography beam, but will intercept residues of the deposition stream ds or sputter beams sb that may pervade through the apertures 310 of the mask 31.

In order to control the thickness of the covering layer of the mask during the life-time of the mask, the apparatus 1 further comprises a tool 63 for laterally resolved measurement of the surface profile of the mask front surface. The tool 63 measures the thickness by means of laser-interferometric methods and the results of these measurements are used to control the sputtering by means of a computer controller 64. Alternatively, the thickness of the mask membrane is controlled by measuring the transmissivity of visible light through the mask, using light fed from backside by light sources (not shown) positioned behind the mask.

FIG. 6 illustrates the effect of sputtering and deposition which is expected for the local morphology of a mask aperture 310. The sectional view of FIG. 6A shows a detail of the mask membrane in a state before it is irradiated at all. On the base material 361 of the mask membrane, for instance silicon, resides a protective layer 363 of, for instance, aluminum having a thickness sufficient to prevent the Ar ions of the lithography beam 1b from penetrating into the silicon material 361. A thin intermediate layer 362 may be present in order to provide for a good contact, or adaption, of the protective layer 363 upon the base material 361. In the non-irradiated state as in FIG. 6A the mask aperture 310 has sharp, well-defined edges 39a; also, the profile of the aperture may have a retrograde shaping 38a in order to reduce the effective depth of the aperture with respect to the optical imaging.

Figure 6A:
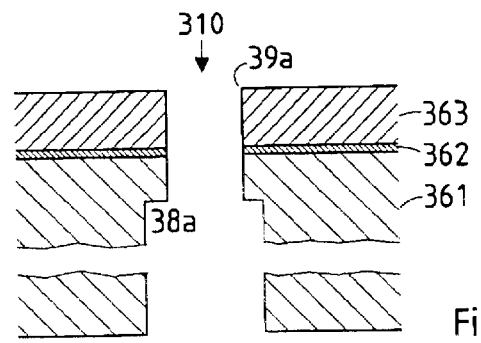
FIG. 6 a detail of a mask structure at three stages (FIG. 6A to 6C)
Figure 6B:
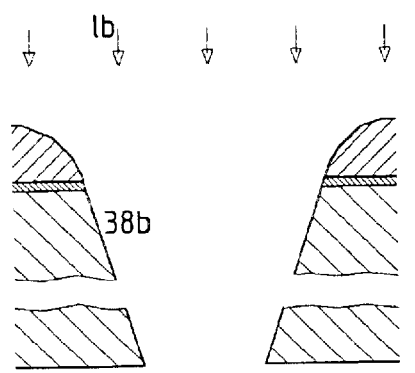
Figure 6C:
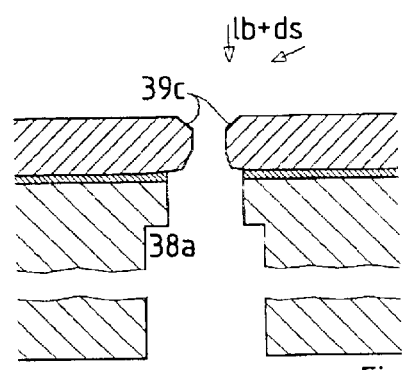
Figure 6D:
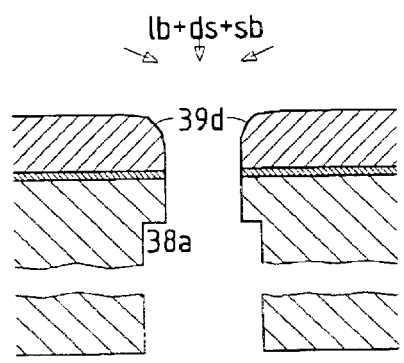

Irradiation of the mask aperture 310 with the radiation of the lithography beam 1b would, in the long run, lead to a profile like the one shown in FIG. 6B without deposition compensation, leading to a slanted profile 38b with a complete loss of the retrograde shape. On the other hand, also a compensation by deposition of material to the protective layer does not ensure maintenance of the aperture structure. FIG. 6c illustrates a configuration which is expected in particular for the case that the lateral dimension of the aperture is small—the lateral width of the aperture is drastically reduced as the edges 39c are growing over the actual aperture. This may lead to a complete loss of the aperture. FIG. 6D shows the local morphology of the aperture which can be stabilized according to the invention. Although the edges 39d of the aperture are rounded to some degree, the lateral width of the aperture as well as the retrograde shaping 38a is ensured.

Effects of local morphological changes, such as the one illustrated in FIG. 6c, are of mesoscopic nature and will appear in particular with the small dimensions features—typically in the order of 1 $\mu$m and below—which are a result of the recent miniaturizing run in the semiconductor field. While effects occurring at a mesoscopic scale could be neglected at the time when, for instance, the DD 211 885 proposed compensation of sputtering by deposition, these effects cannot be ignored at the scales of the stencil mask structures which are now in use.

A stable layer is characterized by a local and global balance of sputtering and growth. Whereas the shape of the equilibrated surface contour is rather variable, depending on a variety of parameters, certain boundary conditions have to be obeyed, for example that inside the openings 310, namely, along the side walls, the ion incidence angle $\alpha$ is necessarily 90°. Regarding this boundary condition it has to be examined in detail whether a full coverage is principally feasible for a given material under realistic irradiation and evaporation conditions. Full coverage implies that the entire membrane thickness of the in situ grown layer is larger than the ion penetration depth.

Since the sputter yield Y (FIG. 8) is generally greater than 1 for massive ions, in principal it should always be possible to find an appropriate deposition rate for which the surface reaches stability after a certain period of "pre-irradiation" by the lithographic beam 1b. In fact, the higher the sputter efficiency, the smaller is the pre-irradiation period necessary to create the equilibrium topography and morphology. For the in situ grown protective layer, sputtering is not a troublesome but a welcome effect to get control of the morphology and surface kinetics, and especially to handle the inevitable implantation of ions into the protective layer. This is facilitated in particular by implementing additional sputter sources 62 according to the invention, which allows for a control of not only the thickness but also the local depth of the protective layer.

The physical parameters available to control the deposition-caused film growth on the protective layer are mainly the film properties (chemical composition), the angular sputter dependence (ratio of ion mass to atom mass of the protective layer), and the working temperature. To a lesser extent, also the layer thickness, the deposition rate and ion dose rate have an influence on the growth.

Figure 8:
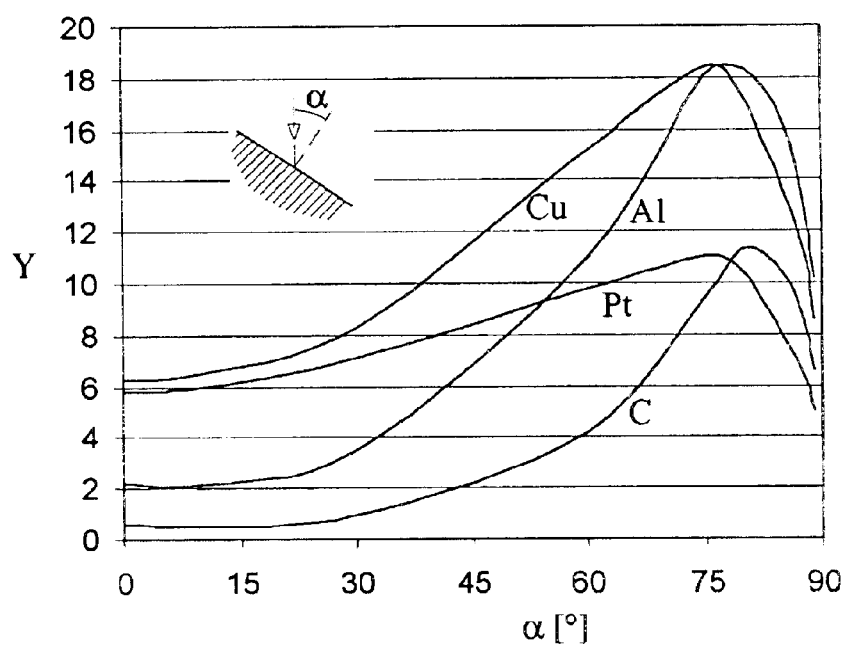
FIG. 8 the sputter yield as a function of the angle of incidence.

As becomes clear from FIG. 8, the effect of sputtering becomes more pronounced towards smaller ion beam incidence angles ($\alpha \sim 70$–$90°$), indicating a tendency towards rounding the edges 39a,39d of the apertures (see FIGS. 6A, 6D). Sharp edges 39a are thermodynamically unstable as the film tends to minimize its surface area, and further, as there is an enhanced escape probability for atoms located near the edge during sputtering. Consequently, assuming homogenous adsorption a mass net transport from the regions to the round edges 39d of the openings is indispensable to retain full coverage during operation. This mass transport has to be driven either by a suitably high adsorbent diffusivity or, indirectly, by enhanced sputtering on the terraces effected by the sputter cleaning beams sb, which preferably remove material from the terraces due to the lower angle $\beta$ of incidence. To adjust the lateral growth of the film, one has the possibility to select elements with suitable surface diffusion rates and angular sputter dependences. Besides, a second (or third) component can be added (alloyed) to the protective layer to optimize the growth behavior (e.g. from island-growth to layer-by-layer growth, adding an impurity working as so called surfectant in the topmost atomic layers).

Beside a strong dependence on the angle $\alpha$, FIG. 8 reveals a substantial element dependency of the sputter yield at normal incidence Y(0), which is even more drastically for angular variations. Consequently, the sputter ratio between regions near the edges of the openings and interstitial regions is controllable to a certain extend via choice of element type(s). With respect to a full coverage, both the angular sputter dependencies and the adsorbent diffusion lengths are equally relevant. Only if both together fit to particular irradiation conditions, a sort of "self adjusted" protective layer will be developed, protecting the entire Si membrane from ion damage. It should be noted that the angular increase in sputter yield varies between 4 to 12 from niob to carbon. This enormous difference in sputter yield explains the possibility to avoid an overgrowing of the stencil openings despite a large adsorbate diffusivity.

From the above it is obvious that the topography of an in situ grown protective layer in equilibrium cannot be perfectly flat, but should be characterized globally by rounded shoulders 39d towards the stencil openings (FIG. 6D), and locally by islands and dusters (not shown) formed by the kinetics of adsorption, re-adsorption and sputtering. There is a coupling of the growth and the sputter processes, since in situ sputtering leads to a local roughening of the surface, and thus to an enhanced number of nucleation sites. With respect to the complexity of all processes involved, the parameters for optimum mask operation, basically the temperature region and the element type(s) forming the protective layer, are to be derived experimentally, e.g. by accelerated lifetime experiments.

Furthermore, to achieve an optimal angular homogeneity of the deposition, it is advantageous if the angle $\beta$ between the incident ion beam 1b and the deposition flow ds is made small since this helps to avoid preferential deposition at faces towards the evaporators. A variant embodiment where this is realized is shown in FIG. 7.

Figure 7:
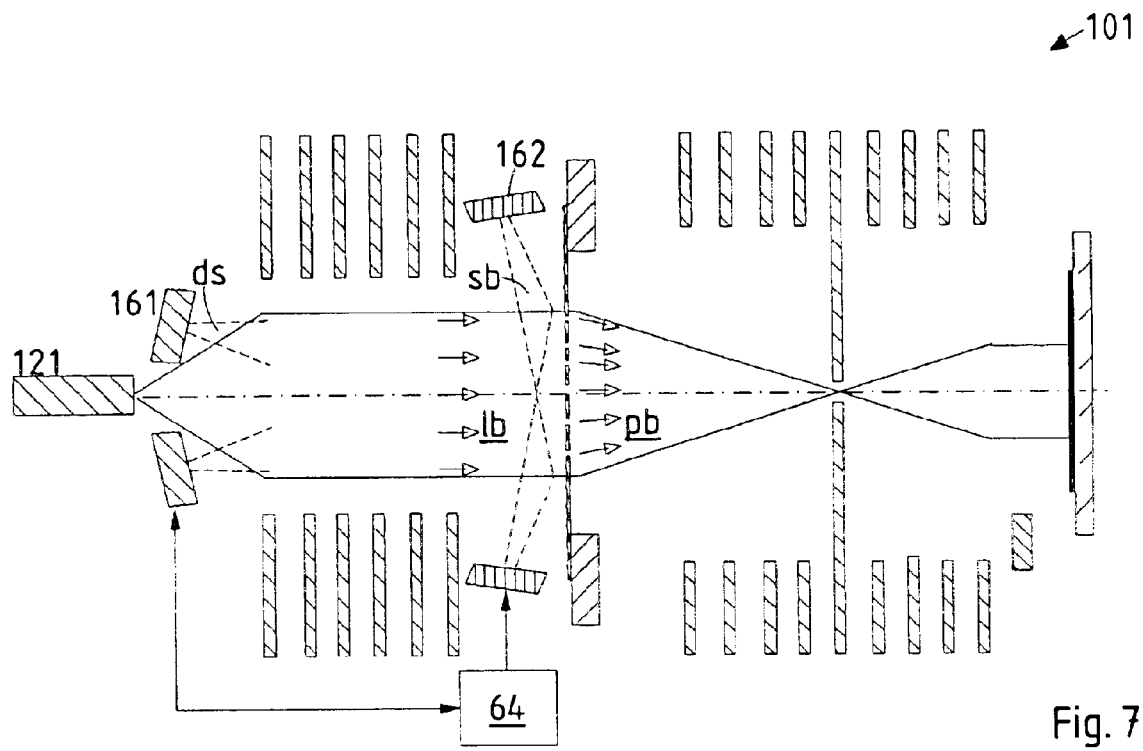
FIG. 7 a lithography apparatus having a variant arrangement of the deposition means.

In the lithography apparatus 101 of FIG. 7 the mask maintenance arrangement is divided in to two groups: The deposition sources are positioned in a first arrangement 161 which surrounds the lithography beam 1b in the vicinity of the ion source 121, while the sputter sources are arranged in a second arrangement 162 which is positioned comparatively near to the mask 31. The tool for laterally resolved measurement of the surface profile of the mask front surface (corresponding to tool 63 of FIG. 1) may suitably be integrated into the deposition arrangement 161. In other respects, the apparatus 101 corresponds to the apparatus 1 of FIG. 1.

It should be noted that in a variant of the invention not shown in the figures, the components belonging to the mask maintenance arrangement according to the invention can also be integrated with the multi-electrode illumination system, for example inside multipole deflector electrodes. This can be done, for instance, when the mask is acting as a grid electrode to form a diverging lens in order to decrease geometric blur, in which case the space before the mask cannot be free of electrostatic fields.

We claim:

1. An apparatus for masked ion-beam irradiation wherein a beam consisting of energetic ions is radiated through a substantially flat stencil mask, said stencil mask comprising a stencil pattern made up of a plurality of transparent structures, and said beam transfers the stencil pattern to a substrate, the apparatus comprising a mask holding means to position said stencil mask in the path of the beam, the apparatus further comprising:

first means for depositing material to said mask, said first means comprising at least one deposition source being positioned in front of the mask as seen in the direction of the beam and outside the path of the beam, the at least one deposition source being suitable for depositing material to the side of the mask irradiated by the beam, and second means for sputtering off material from said mask, said second means comprising at least one sputter source producing a sputter ion beam directed to the mask, the at least one sputter source being positioned in front of the mask holder means as seen in the direction of the beam of energetic ions and outside the path of the beam of energetic ions.

2. The apparatus of claim 1, wherein the second means comprises deflection means to adjust the direction of the sputter ion beam(s).

3. The apparatus of claim 2, wherein the deflection means comprises an electrostatic ion-optical arrangement.

4. The apparatus of claim 2, wherein the lateral size of the sputter ion beam(s), as measured in the plane of the mask, is smaller than the dimension of the structure pattern area of the stencil mask by at least one order of magnitude.

5. The apparatus of claim 1, wherein the direction of the sputter ion beam forms an angle ($\beta$) with the beam of energetic ions of at least 30°.

6. The apparatus of claim 5, wherein the angle is at least 60°.

7. The apparatus of claim 1, wherein the second means comprises a plurality of sputter sources arranged on a ring around the beam of energetic ions.

8. The apparatus of claim 1, wherein the second means comprises a sputter source mounted on a positioning means to rotate the sputter source around an axis as defined by the beam of energetic ions.

9. The apparatus of claim 1, further comprising a measuring means to measure the thickness and/or the surface profile of the stencil mask in the area of the stencil pattern, the measuring means being connected to a controlling means to control sputtering with the sputter source(s).

10. The apparatus of claim 1, wherein the mask holding means comprises an aperture means being positioned immediately in front of the side of the mask irradiated by the beam of energetic ions, the aperture means having an aperture corresponding to a selected portion of said side of the mask.

11. The apparatus of claim 1 for use in masked ion-beam lithography.

12. An apparatus for masked ion-beam lithography wherein a lithography beam consisting of energetic ions is radiated through a substantially flat stencil mask, said stencil mask comprising a stencil pattern made up of a plurality of transparent structures, and said lithography beam transfers the stencil pattern to a substrate, the apparatus comprising:

a mask holding means to position said stencil mask in the path of the lithography beam;

a deposition source for depositing material to said mask, said deposition source being positioned in front of the mask as seen in the direction of the lithography beam and outside the path of the lithography beam, and being suitable for depositing material to the side of the mask irradiated by the lithography beam; and a sputter source producing a sputter ion beam directed to the mask, said sputter source being positioned in front of the mask holder means as seen in the direction of the lithography beam and outside the path of the lithography beam.

* * * * *